(12) United States Patent
Huang et al.

(10) Patent No.: US 11,307,951 B2
(45) Date of Patent: Apr. 19, 2022

(54) MEMORY DEVICE WITH CONFIGURABLE PERFORMANCE AND DEFECTIVITY MANAGEMENT

(71) Applicant: Micron Technology, Inc., Boise, ID (US)

(72) Inventors: Jianmin Huang, San Carlos, CA (US); Xiangang Luo, Fremont, CA (US); Kulachet Tanpairoj, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 278 days.

(21) Appl. No.: 16/560,560

(22) Filed: Sep. 4, 2019

(65) Prior Publication Data

US 2021/0064495 A1 Mar. 4, 2021

(51) Int. Cl.
  *G06F 11/00* (2006.01)
  *G06F 11/30* (2006.01)
  (Continued)

(52) U.S. Cl.
  CPC ........ *G06F 11/3037* (2013.01); *G06F 11/076* (2013.01); *G06F 11/3062* (2013.01);
  (Continued)

(58) Field of Classification Search
  CPC ............... G06F 11/3037; G06F 11/076; G06F 11/3062; G06F 11/0751; G06F 11/0754; G06F 11/30; G06F 11/3003; G06F 11/3058; G06F 12/1433; G06F 11/073; G06F 11/3409; G06F 12/0246; G06F 2201/81; G06F 2212/7203; G06F 2212/7205; G06F 2212/7208; G06F 2212/7211;
  (Continued)

(56) References Cited

U.S. PATENT DOCUMENTS

| | | | |
|---|---|---|---|
| 2010/0064111 A1* | 3/2010 | Kunimatsu | G06F 12/08 711/161 |
| 2015/0049547 A1* | 2/2015 | Kim | G11C 29/023 365/185.09 |

(Continued)

*Primary Examiner* — Anthony J Amoroso
(74) *Attorney, Agent, or Firm* — Schwegman Lundberg & Woessner, P.A.

(57) ABSTRACT

A memory device comprises a memory control unit including a processor configured to control operation of the memory array according to a first memory management protocol for memory access operations, the first memory management protocol including boundary conditions for multiple operating conditions comprising program/erase (P/E) cycles, error management operations, drive writes per day (DWPD), and power consumption; monitor operating conditions of the memory array for the P/E cycles, error management operations, DWPD, and power consumption; determine when a boundary condition for one of the multiple operating conditions is met; and in response to determining that a first boundary condition for a first monitored operating condition is met, change one or more operating conditions of the first memory management protocol to establish a second memory management protocol for the memory access operations, the second memory management protocol including a change boundary condition of a second monitored operating condition.

18 Claims, 6 Drawing Sheets

(51) Int. Cl.
*G11C 29/02* (2006.01)
*G06F 12/14* (2006.01)
*G11C 16/14* (2006.01)
*G06F 11/07* (2006.01)
*G06F 11/34* (2006.01)

(52) U.S. Cl.
CPC ...... *G06F 11/3409* (2013.01); *G06F 12/1433* (2013.01); *G11C 16/14* (2013.01); *G11C 29/02* (2013.01); *G11C 29/028* (2013.01)

(58) Field of Classification Search
CPC ......... G11C 16/14; G11C 29/02; G11C 16/10; G11C 16/16; G11C 16/3495; G11C 29/028; G11C 29/52; G11C 2029/0409; G11C 11/5628; G11C 11/5635
See application file for complete search history.

(56) References Cited

U.S. PATENT DOCUMENTS

| | | | | |
|---|---|---|---|---|
| 2018/0088860 A1* | 3/2018 | Erickson | ................. | G06F 3/061 |
| 2019/0013079 A1* | 1/2019 | Blodgett | ............. | G06F 12/1441 |
| 2019/0035474 A1* | 1/2019 | Tassan | ................. | G11C 16/105 |
| 2020/0402582 A1* | 12/2020 | Yang | ...................... | G11C 16/10 |

* cited by examiner

MEMORY DEVICE WITH CONFIGURABLE PERFORMANCE AND DEFECTIVITY MANAGEMENT

Embodiments of the disclosure relate to managed memory devices, and more specifically relate to a memory device that can provide multiple configurations to address multiple competing requirements of a memory system.

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc., as discussed further below.

Implementations of electronic systems with memory devices have different requirements. For example, it may be desired to place a premium on performance of the memory device for one system, while it may be desired to place a premium on endurance of the memory arrays of the memory device of another system. There can be a tradeoff between the different requirements for a memory system. Typically, a given memory device is specifically designed to provide the desired tradeoff among competing requirements. It is difficult to provide one memory device product that will meet the needs of different systems. There would be a benefit from improvement in one or both of the operation and the interoperability of currently known systems.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
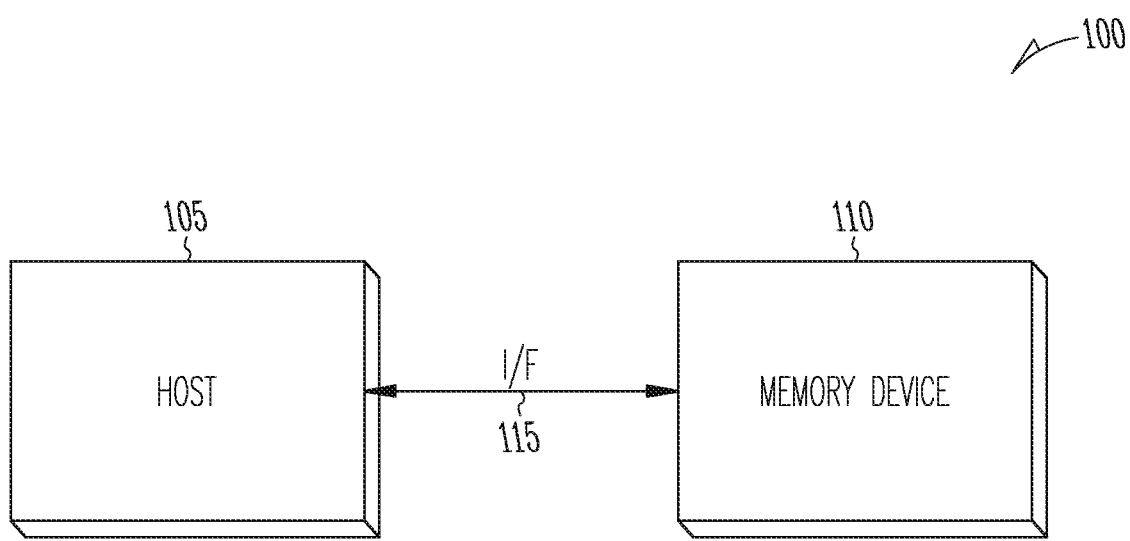
FIG. 1 illustrates an example system including a host and a memory device according to some examples described herein.

Memory devices can include arrays of memory cells. Managed memory devices can include a memory control unit to control or manage access to the memory arrays according to multiple memory management protocols. These protocols may be implemented in firmware installed in the memory control unit and can be performed using processing circuitry. Many of the protocols can be interlinked so that changing one protocol has an effect on one or more other protocols. Changing or limiting any one protocol will have an impact on other factors and system behaviors. A conventional approach is to develop a specific memory system for a specific implementation. A better approach is a memory management protocols that self-adjusts according to the implementation. The self-adjusting may be in response to detected operating conditions of the memory system.

Memory devices include individual memory die, which may, for example, include including a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, as a "host" device as discussed later herein. In such managed memory devices, the controller functionality may be implemented on one or more die also incorporating a memory array, or on a separate die). In other examples, one or more memory devices may be combined with controller functionality to form a solid-stage drive (SSD) storage volume.

Embodiments of the present disclosure are described in the example of managed memory devices implementing NAND flash memory cells, termed "managed NAND" devices. These examples, however, are not limiting on the scope of the disclosure, which may be implemented in other forms of memory devices and/or with other forms of storage technology.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states).

Managed memory devices may be configured and operated in accordance with recognized industry standards. For example, managed NAND devices may be (as non-limiting examples), a Universal Flash Storage (UFS™) device, or an embedded MMC device (eMMC™), etc. For example, in the case of the above examples, UFS devices may be configured in accordance with Joint Electron Device Engineering Council (JEDEC) standards (e.g., JEDEC standard JESD223D, entitled JEDEC UFS Flash Storage 3.0, etc., and/or updates or subsequent versions to such standard. Similarly, identified eMMC devices may be configured in accordance with JEDEC standard JESD84-A51, entitled "JEDEC eMMC standard 5.1", again, and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact. Managed memory devices, for example managed NAND devices, can be used as primary or ancillary memory in various forms of electronic devices, and are commonly used in mobile devices.

Both SSDs and managed memory devices can include a number of memory devices, including a number of dies or logical units (e.g., logical unit numbers or LUNs), and can include one or more processors or other controllers performing logic functions required to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or SRAM (or other forms of memory die or other memory structures). Similarly, managed NAND devices can include one or more arrays of volatile and/or nonvolatile memory separate from the NAND storage array, and either within or separate from a controller. Both SSDs and managed NAND devices can receive commands from a host in association with memory operations, such as read or write operations to transfer data (e.g., user data and associated integrity data, such as error data and address data, etc.) between the memory devices and the host, or erase operations to erase data from the memory devices.

FIG. 1 illustrates an example system 100 including a host 105 and a memory device 110. The host 105 can include a host processor, a central processing unit, or one or more other device, processor, or controller. The memory device 110 can include a universal flash storage (UFS) device, an embedded MMC (eMMC™) device, or one or more other memory devices. The host 105 and the memory device 110 can communicate using a communication interface (I/F) 115 (e.g., a bidirectional parallel or serial communication interface).

In an example, the memory device 110 can include a UFS device, and the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, the memory device 110 can include an eMMC™ device, and the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the memory device 110 can include one or more other memory devices, or the communication interface 115 can include one or more other interfaces, depending on the host 105 and the memory device 110. The identified standards are provided only as example environments in which the described methods and structures may be utilized; but such methods and structures may be utilized in a variety of environments outside of the identified standards (or of any actual or proposed standards).

Each of the host 105 and the memory device 110 can include a number of receiver or driver circuits configured to send or receive signals over the communication interface 115, or interface circuits, such as data control units, sampling circuits, or other *intermedia* circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory control unit, and in certain examples, an interface circuit between the memory array and the memory control unit. In certain examples, the memory array can include a number of memory die, each having control logic separate from the memory control unit. The memory control unit can include an application specific integrated circuit (ASIC), a field programmable gate array (FPGA), or one or more other processing circuits arranged or programmed to manage data transfers or operations to, from, or within the memory array.

Figure 2:
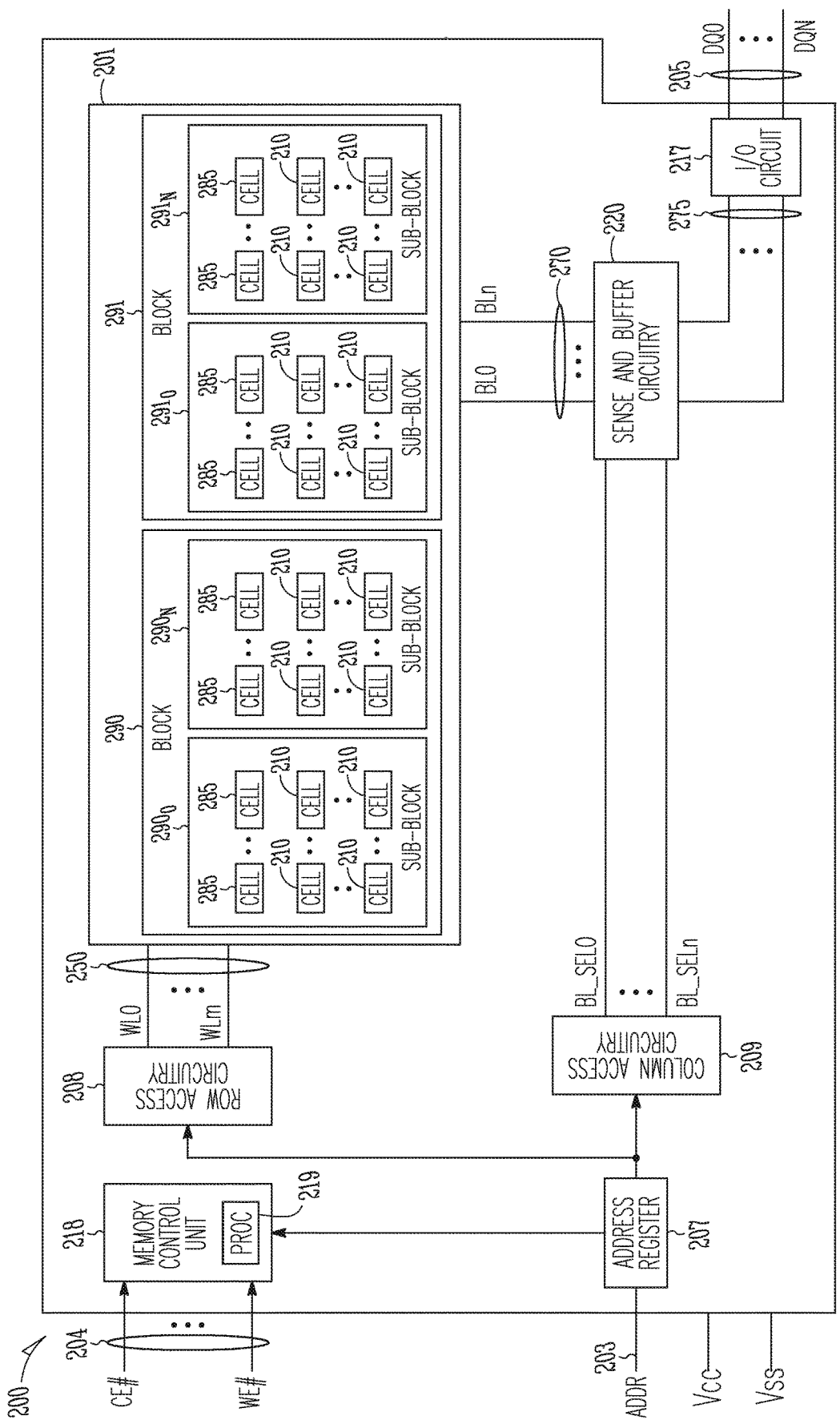
FIG. 2 is a block diagram of an apparatus in the form of a memory device including non-volatile memory cells according to some examples described herein.

FIG. 2 shows a block diagram of an example memory device 200 suitable for use as memory device memory device 110 in FIG. 1. The memory device can include non-volatile memory cells having mixed memory cell types integrated in the same integrated circuit (IC) chip, according to some examples described herein. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different non-volatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290o$, $290_n$, $291o$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include processing circuitry components such as processor 219, a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE #, a write enable signal WE #) to indicate which operation (e.g., read, write, or erase operation) memory device 200 can perform.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a memory controller, memory control unit, or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed individually or collectively to one or a number of programmed states. For example, a single-level cell (SLC) can represent one of two programmed states (e.g., 1 or 0), representing one bit of data. However, flash memory cells can also be multi-level cells (MLCs) that represent one of more than two programmed states, allowing the manufacture of higher density memories without increasing the number of memory cells, as each cell can represent more than one binary digit (e.g., more than one bit).

In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell). MLC is used herein in its broader context, to refer to any memory cell that can store more than one bit of data per cell (i.e., that can represent more than two programmed states, including a triple-level cell (TLC) can refer to a memory cell that can store three bits of data per cell (e.g., one of eight programmed states), and a quad-level cell (QLC) can store four bits of data per cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

Memory devices may experience deterioration as a function of time and/or use which can limit their effective life. For example, in the case of flash storage devices, such as NAND memory, the memory devices may only be written for a limited number of times. At the end of a flash device's usage life, data may be corrupted, or the device may be rendered unusable if measures are not proactively taken to manage the device's lifespan. In NAND flash memory cells, electrons are trapped to the memory cell each time when data is written (e.g., via a programming operation), and electrons are taken off when data is removed (e.g., via an erasure operation). Each time electrons go in and out through the tunnel oxide during a program/erase (P/E) cycle may wear out the tunnel oxide, and thus reduce the device's lifetime.

The P/E cycles may be used to quantify an endurance of a flash device. Endurance may be expressed as a drive writes per day (DWPD), which measures how many times a host can overwrite the drive's entire size each day of its life. For example, for an SSD with a size of 200 GB and a warranty period of 5 years, if DWPD is 1, then 200 GB can be written into the device every day for the next five years. That corresponds to 200 GB×365 days×5 years=365 TB of cumulative writes before the device is expected to fail. If DWPD is 10, then every single day 10×200 GB=2 TB can be written into the device. Endurance may alternatively be expressed as terabytes written (TBW), which measures total data writable into the drive over its lifetime. For example, for an SSD rated for 365 TBW, up to 365 TB data can be written before the drive is set for replacement. The guaranteed TBW can be provided by the vendor in their specifications. A target writes per day can be calculated using the TBW and target lifetime (e.g., a warranty of target lifetime such as 3-5 years). For example, for an SSD with a TBW of 120 TB and a warranty period of 3 years, target daily writes may be calculated as 120 TB/3 years/365 days/1024=110 GB per day.

Normal operation of a flash memory may involve a large amount of writing (programming) and erasure of memory cells. Garbage collection (GC) is an operation to manage memory utilization in a flash memory. When the free physical space in a flash memory gets low, GC can recover free space on the storage device to allow for new host data to be written. During GC, a flash block that contains pages with valid data and pages with stale data (garbage) is read. Pages with the valid data are preserved, by writing to another fresh block. The logical block address is then updated with the new location. Pages with stale data marked for deletion remain on the location in the old block. Then, the entire old block (that contains pages with the stale data) is erased. The erased block can be added to the free block pool and used for a new incoming write. Such data written to pages and block erasure can lead to write amplification (WA). A numerical WA metric can be determined using a ratio of the amount of data physically written to the flash memory (physical writes) to the amount of data the host originally intended to write (host writes). The actual physical writes are generally larger than the host writes, resulting in a WA metric greater than one.

The GC operation can consume a lot of read/write bandwidth in a flash memory. As GC takes valid date already written by the host and rewrites them again, a large WA may result. The repeated physical act of moving data can degrade or wear out the insulator layer of tunnel oxide, reduce NAND flash lifespan, and slow down the device's erase process. When a block fails to erase, a spare block needs to be used. Eventually, when the spares run out, the SSD can fail.

Additionally, if performed concurrently with host operations, GC can significantly degrade device performance and user experience. Moreover, if the GC operation is performed all the time, the storage device would consume all its available life very quickly, leading to an unusably short lifetime. Alternatively, if the device is underused (includes fewer device accesses, such as experiences lower DWPD), and the GC engine does not adapt to such device underuse, then conservative GC activities may be performed, which can reduce device performance and the user experience. Therefore, the present disclosure addresses example memory management solutions that can balance between the potentially competing concerns of device endurance and user experience.

It is difficult to have one memory device meet the requirements of all systems that use a memory device. Different electronic systems may have competing requirements. Some examples of requirements for a memory device include a high degree of memory cell endurance or long device lifetime, high performance or speed, low power consumption, and protection or recovery from memory defects. Table 1 shows an example of relative memory capabilities that may be adjusted for memory devices.

TABLE 1

| | Features | | | |
|---|---|---|---|---|
| Option | TBW (Device Life/Endurance) | Performance | Power Consumption | Defectivity Protection |
| 1 | Highest | Medium | Low | Low |
| 2 | High | High | Medium | Medium |
| 3 | Medium | Highest | Highest | High |
| 4 | Low | Low | Medium | Highest |

A conventional approach is to customize a memory device to the requirements of a particular electronic system. For example, a first memory device may be configured (including established controller functionality) for use in a mobile phone, or similar application; while a second memory device may be configured for use in an automotive application. In the mobile phone application, defectivity protection may be of lesser concern than low power consumption (and or other considerations, such as those of Table 1); while in an automotive application defectively protection may be a predominant concern, compared to, for example power consumption. However, the required memory devices may have a complicated architecture that involves a long development time. Additionally, developing such application-specific memory devices complicates managing of memory device inventory for both the manufacturer and customers, and is thus disadvantageous for both. Further, such application-specific memory devices still fail to address device performance and endurance resulting from different use characteristics (for example, a mobile phone used relatively infrequently, vs. one used heavily, for example by a "power user," requiring both greater and more frequent memory accesses).

Instead of custom memory devices, the present disclosure addresses examples of configurable memory devices. A memory device may perform multiple memory management protocols. For example, one protocol can be used to set the level of defectivity protection such as by storing parity or redundant data. Another protocol can change the endurance of memory cells by setting the number of levels (e.g., SLC, MLC, TLC, etc.) for the memory cells. In some embodiments, the protocols are included in submodules of firmware of the memory control unit. In a configurable memory device, the firmware can be changed to achieve the desired set of memory device requirements. An even better approach is for the memory management protocols to be self-adjusting.

Figure 3:
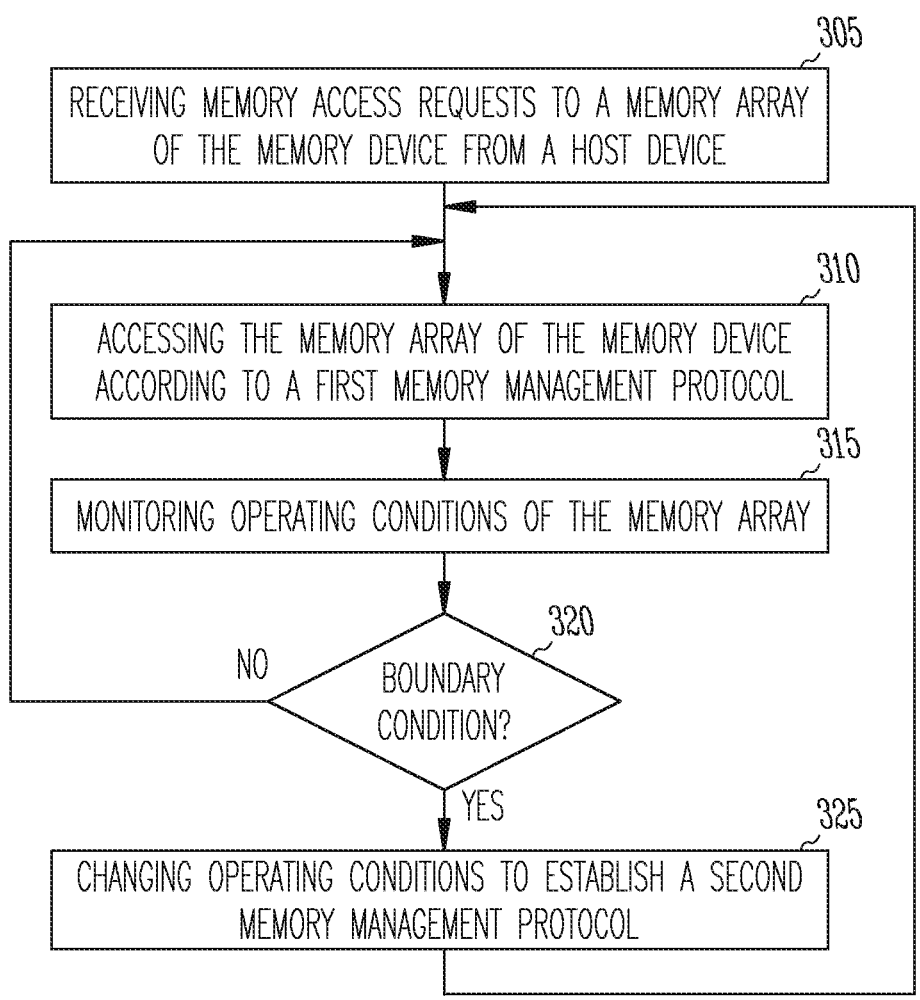
FIG. 3 is a flow diagram of an example of a method of operating a memory device according to some examples described herein.

FIG. 3 is a flow diagram of an example of a method 300 of operating a memory device, for example by memory device 110 as described relative to FIG. 1, or memory device 200 as described relative to FIG. 2. At 305, memory access requests to a memory array of the memory device are received by the memory device from a host device.

At 310, the memory device accesses the memory array of the memory device according to a first memory management protocol. The first memory management protocol may be one of multiple memory management protocols included in firmware of the memory device. The memory device may include a processor to execute instructions included in the firmware of the memory device. Executing or performing the instructions causes the processor to perform the memory management protocols for memory access operations. The first memory management protocol includes boundary conditions for multiple operating conditions such as program/erase (P/E) cycles, error management operations, drive writes per day (DWPD), and power consumption for example. The boundary conditions are conditions that are outside specified performance bounds or thresholds. Other examples include boundary conditions for the number of memory cell defects, the number of memory errors, the access rate of the memory arrays or portions of the memory arrays, and for operating conditions associated with the endurance of the memory cells.

At 315, the memory device monitors operating conditions of the memory array associated with responding to the memory access requests, such as the program/erase (P/E) cycles, error management operations, drive writes per day (DWPD), and power consumption, etc. If the memory control unit determines at 320 that one or more operating conditions has met one or more of the boundary conditions, the memory control unit at 325 changes one or more operating conditions of the first memory management protocol to establish a second memory management protocol for the memory access operations. The second memory management protocol includes a changed boundary condition of a second monitored operating condition.

For example, the memory control unit may perform a memory cell defectivity protocol as the first protocol. The memory cell defectivity protocol may manage defects of memory cells that occur during operation of the memory system. The memory cell defectivity protocol may perform one or more of error detection and error correction in response to detected memory cell defects. The processor of the memory control unit may monitor, as the first operating condition, the rate at which the memory cell defectivity protocol is activated. A change in the activation rate may indicate a change in the number of defects in the memory cells. In response to the determined activation rate of the memory cell defectivity protocol meeting a boundary condition, the memory control unit may change one or more other (i.e., second) operating conditions. For instance, the memory control unit may change one or more of the number of memory cells subject to error detection for a memory access request, the number of parity bits stored for a memory access request, and the amount of duplicated data written as part of the memory access request. The processor changes the boundary conditions of this second operating condition. The change in boundary conditions may increase or decrease the level of protection from defects to establish an adjusted memory cell defectivity protocol as the second memory management protocol. If the activation rate is low, the level of defect protection can be reduced to free up resources for other purposes. If the activation rate is high, the level of protection can be increased or maintained.

As explained previously herein, the memory management protocols may be interlinked. For instance, the operating conditions of the memory cell defectivity protocol may be interlinked with operating conditions of a protocol to manage to system performance. A memory cell defectivity protocol may use Redundant Array of Independent NAND (RAIN) technology. RAIN adds user data protection that extends beyond ECC. In RAIN protection, the memory control unit may use parallelism in order to increase memory device performance and locate stored data across a set of flash devices, which may be realized as many relatively smaller flash devices to attain a large capacity associated with other storage devices. This parallelism can be spread across multiple flash devices of the set. This can be referred to as striped data without parity. The portions of the different memory devices that store the split data are collectively referred to as a stripe. RAIN can also include mirroring, which can include storing duplicate copies of data on more than one page of more than one device. The multiple devices in a RAIN array may appear to a user and the operating system of a host device as a single memory device. With a high degree of parallelism, adding a parity protection architecture adds another layer of protection.

Because a RAIN stripe can be a combination of user data, other data, and parity data, the parity data can reduce the capacity of the memory device to store user data and can affect the performance of the memory device. A protocol to manage system performance may monitor operating conditions of the memory device in responding to memory access requests and may alter parameters of the RAIN protection to adjust the performance.

Figure 4:
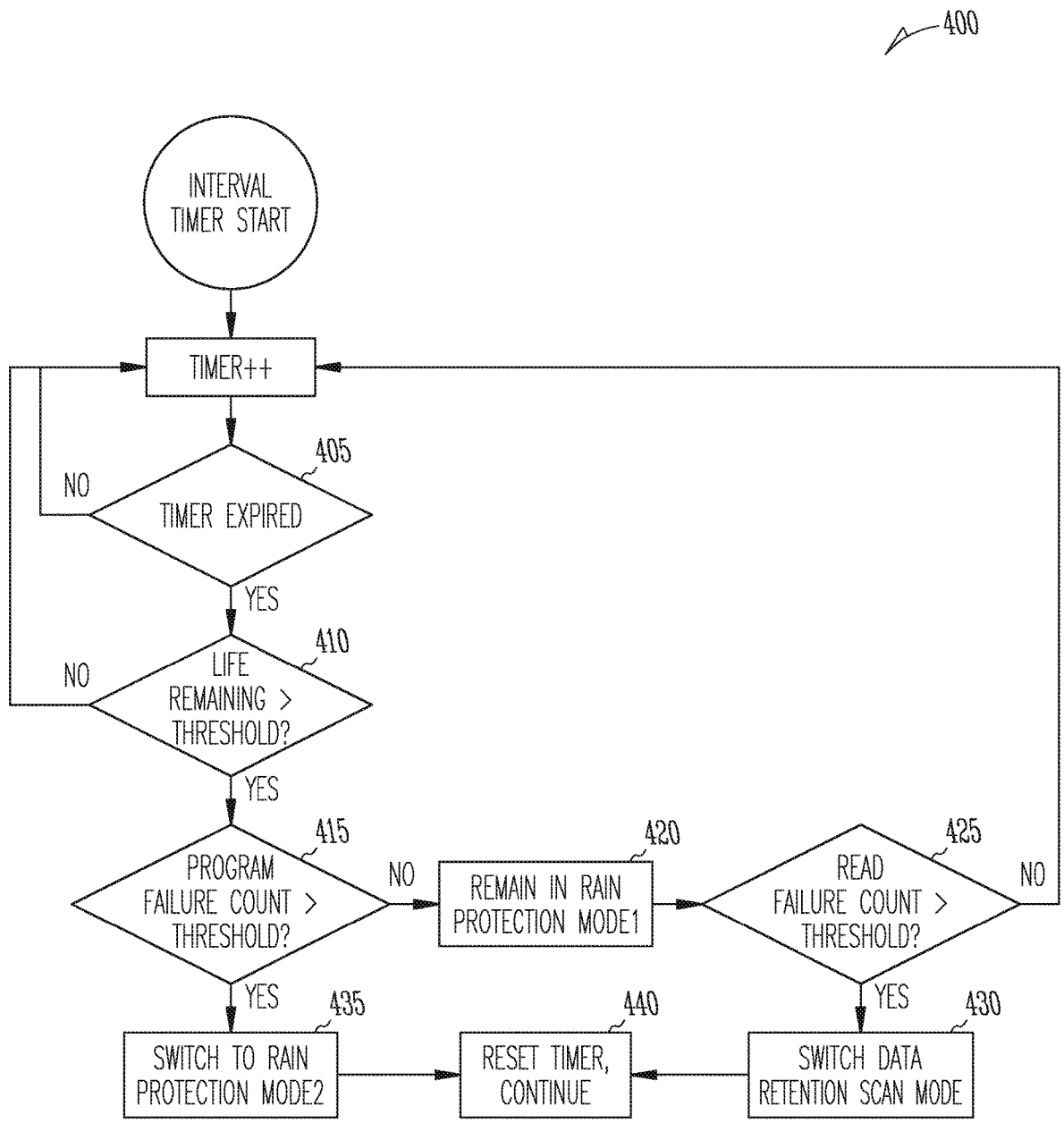
FIG. 4 is a flow diagram of another example of a method of operating a memory device according to some examples described herein.

FIG. 4 is a flow diagram of another example of a method 400 of operating a memory device, for example by memory device 110 as described relative to FIG. 1, or memory device 200 as described relative to FIG. 2. The memory control unit may implement a timer either in hardware or firmware. When a timed interval expires at 405 the memory control unit checks if an operating condition related to the life remaining in the memory cells meets a boundary condition (e.g., if the operating condition indicates the remaining life is greater than a threshold) at 410. If it is early enough in the lifetime of the memory, the memory control unit may check for an opportunity to adjust one or more operating conditions of the RAIN protection protocol. The RAIN protection protocol may have multiple protection modes (e.g., Protection Mode 1 and Protection Mode 2). Mode 1 protects against a large amount of failures and is more stringent than Mode 2.

For example, the memory control unit may check a failure metric such as a failure count or a failure rate as the operating condition related to remaining lifetime. At 415, if the failure from programming is greater than a specified threshold, the memory control unit maintains the RAIN protection in Protection Mode 1, the higher protection mode, at 420. If the read failure count is also greater than a specified threshold at 425, the memory control unit may change the data retention scan mode at 430. If the failure from programming is not greater than the specified threshold at 415, the memory control unit may switch the RAIN protection to Protection Mode 2, the lower protection mode, at 435. At 440, the timer is reset, and the RAIN protection is reevaluated again when the timed interval expires.

Because Protection Mode 1 is more stringent, Mode 1 may use more system resources. By changing to Protection Mode 2, more resources are freed up to be used for other operations. For instance, changing the Protection Mode may change the number of bits of parity data (change number of parity bits stored, or number of bits checked with parity), change the amount of duplicate data written, or change the protection provided to the stripes. Thus, the memory control unit may self-adjust to change memory cell defectivity parameters to achieve a desired system performance level.

As another example, operating conditions of a memory management protocol to manage memory system performance may be interlinked with operating conditions of a memory management protocol to manage memory endurance. A system performance management protocol may implement SLC caching to adjust performance of the memory device. As previously described, a memory cell of a memory device can be arranged as either an SLC or MLC (e.g., MLC, TLC, QLC, etc.). Compared to MLC storage, SLC cells generally store less data, and manufacturing memory devices in capacities suitable for use as a storage device using just SLC memory cells is less cost effective. However, SLC memory cells may offer better performance with higher reliability. For example, SLC cells may be written to with fewer programming pulses, thereby reducing the chances of corruption from an unexpected power loss during programming. A compromise solution to memory management is using an SLC cache, where some cells may be configured as SLC and other cells as MLC. For example, data may be first written to the SLC, and later transferred to the MLC when the memory device is not busy (e.g., idle state).

The SLC cache mechanism provides a balance between the speed and reliability of SLC memory cells with the storage capacity of MLC memory cells. The memory cells may be reconfigurable by a system performance protocol between SLC and MLC, and the cache size can vary during usage (dynamic size SLC cache). For example, the SLC cache size can vary based upon how full the memory device is (device utilization). As the device fills up, memory cells configured as SLC cache are migrated to MLC to increase total data storage capacity.

Monitoring the host access pattern when setting SLC cache size allows the system performance management protocol to increase the SLC cache to provide greater burst performance and a better user experience for light workload users. A lighter workload generally corresponds to a host device access pattern indicating the memory device is underused, such as by infrequent input-output (I/O) access, or a low rate of transitions between active I/O access states and idle states. In contrast, a heavier workload generally corresponds to a host access pattern characterized by more frequent I/O access, or a higher rate of transitions between active I/O access states and idle states. In such a case, the system performance protocol may reduce the SLC cache size such as by reallocating more SLC memory cells to MLC storage. With the majority of host data written directly to MLC storage, the total data written to the physical media can be reduced.

The protocol to manage memory endurance may monitor an operating condition related to memory cell endurance and adjust an operating condition related to system performance based on the value of the memory cell endurance parameter.

An example of an operating condition related to memory cell endurance is the number of program cycles and erase cycles performed on memory cells, or the rate that P/E cycles are being requested by the host device. Based on the number of P/E cycles requested, a memory management protocol may self-adjust to meet memory endurance goals by changing operating conditions of the SLC caching. Thus, the memory control unit may reduce system performance to increase device lifetime.

Figure 5:
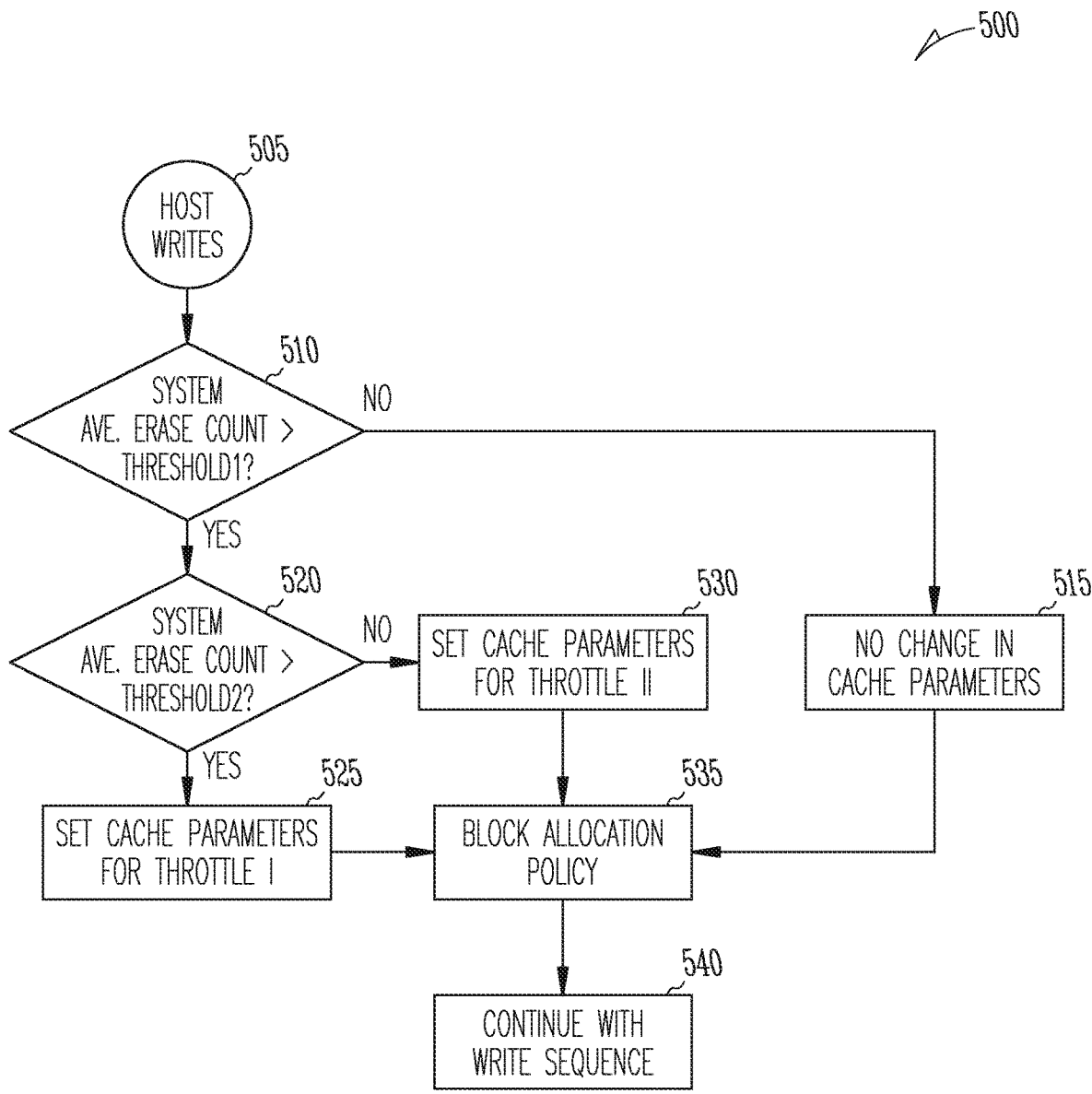
FIG. 5 is a flow diagram of another example of a method of operating a memory device according to some examples described herein.

FIG. 5 is a flow diagram of another example of a method 500 of operating a memory device, for example by memory device 110 as described relative to FIG. 1, or memory device 200 as described relative to FIG. 2. At 505, a host write request is received by the memory device. In response to the write request, the memory control unit checks the value of a system average erase count at 510. The average erase count may be an average taken over a specified period of time. If the average erase count exceeds a specified average count, the erase count may indicate that the memory cells are approaching the end of their useable life. To extend useable life, one or more SLC cache parameters may be changed so that the erase consumption rate is lowered to achieve the memory endurance goals for the device.

At 515, if the system average erase count is less than a first threshold count (threshold 1), no change is made by the memory control unit to the cache operation. If the system average erase count is greater than the first threshold count, at 520 the memory control unit checks the system average erase count to the second threshold (threshold 2). If the system average erase count is greater than both the threshold counts, at 525 the memory control unit changes one or more cache operating conditions to reduce or "throttle" the erasure rate (throttle I). The erasure rate can be reduced by changing the cache allocation. For example, less memory cells can be allocated for SLCs in the memory and more cells can be allocated to MLCs (or TLCs, QLCs, etc.). In another example, the access policy to the SLC cache can be changed so that less access requests are allowed to use the SLC cache. If the system average erase count is greater than the first threshold but less than the second threshold, the memory control unit at 530 changes one or more cache parameters to reduce the erasure to a second erasure rate (throttle II) that may be higher than the throttle I rate but less than the original erasure rate. At 535, the new cache block allocation policy is implemented, and the write sequence continues at 540.

It can be seen that the memory management protocols may attempt to reach the endurance goals of the memory device by changing the SLC cache allocation. Thus, the attempts by the memory device to extend the useable life of the memory may be interlinked to the system performance of the memory device. The memory management protocols can self-adjust in response to behaviors of the host (e.g., overuse or underuse of the memory) to improve useable lifetime of the memory system.

In another example, the operating conditions of a protocol to manage memory endurance may be interlinked with operating conditions of a protocol to manage memory cell defectivity. Based on an operating condition related to memory cell endurance meeting a boundary condition, the memory control unit may change one or more of the number of memory cells subject to error detection for a memory access request, the number of parity bits stored for the memory access request, and the amount of duplicated data written as part of the memory access request. This can increase memory life by reducing the number of memory cells used in checking for memory cell defectivity.

In still another example, the operating conditions of a protocol to manage power consumption of the memory device may be interlinked with operating conditions of a protocol to manage system performance and operating conditions of a memory cell defectivity protocol. The power consumption management protocol may monitor an operating condition related to power consumed by the memory array in responding to the memory access requests. If the operating condition related to power consumed meets a boundary condition, the memory control unit may change one or more of a number of memory cells subject to error detection, an amount of duplicated data written to the memory array, a number of parity bits stored, and an access policy to memory cell cache granted to the memory access requests.

The methods, devices, and systems described herein can reduce cost and time of memory device development. The memory device self-adjusts or self-tunes by learning the behavior of the host device in accessing the memory. The memory system is optimized by the memory device optimizing its memory management protocols throughout the lifetime of the memory device by monitoring the operating conditions, collecting data on system performance, and using the operating conditions and data as inputs to the self-adjusting memory management protocols.

Figure 6:
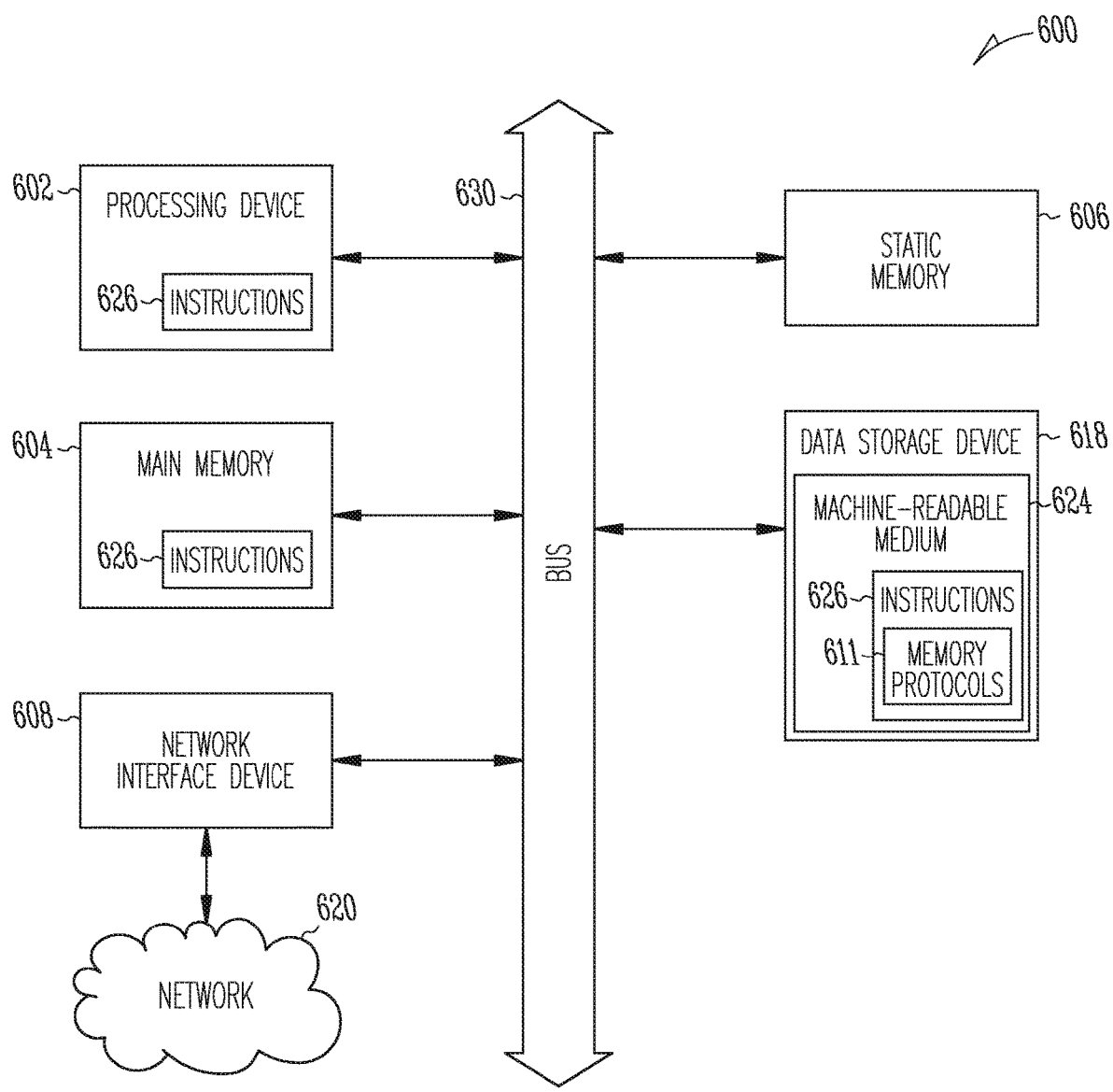
FIG. 6 illustrates a block diagram of an example machine according to some examples described herein.

FIG. 6 illustrates a block diagram of an example machine 600 upon which any one or more of the techniques (e.g., methodologies) discussed herein may perform, such as the described finer trim programming operations for extreme operating temperatures for example. In alternative examples, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 600 (e.g., the host 105, the memory device 110 of FIG. 1, etc.) may include a processing device 602 (e.g., a hardware processor, a central processing unit (CPU), a graphics processing unit (GPU), a hardware processor core, or any combination thereof, such as a memory control unit of the memory device 110, etc.), a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random-access memory (SRAM), etc.), and a data storage system 618, some or all of which may communicate with each other via an interlink (e.g., bus) 630.

The processing device 602 can represent one or more general-purpose processing devices such as a microprocessor, a central processing unit, or the like. More particularly, the processing device 602 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The machine 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the machine 600, the main memory 604 and the processing device 602 also constituting machine-readable storage media. The machine-readable storage medium 624, the data storage system 618, or the main memory 604 can correspond to the memory device 60 of FIG. 1. In one implementation, the instructions 626 include instructions 611 to implement functionality corresponding to self-adjusting memory management protocols (e.g., the operation of FIG. 3).

While the machine-readable storage medium 624 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the data storage device 618 can be accessed by the main memory 604 for use by the processing device 602. The main memory 604 (e.g., DRAM) is typically fast, but volatile, and thus a different type of storage than the data storage device 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the data storage device 618 can be allocated to supplement the main memory 604; however, because the data storage device 618 device is typically slower than the main memory 604, and write speeds are typically at least twice as slow as read speeds, use of virtual memory can greatly reduce user experience due to storage device latency (in contrast to the main memory 604, e.g., DRAM). Further, use of the data storage device 618 for virtual memory can greatly reduce the usable lifespan of the data storage device 618.

In contrast to virtual memory, virtual memory compression (e.g., the Linux™ kernel feature "ZRAM") uses part of the memory as compressed block storage to avoid paging to the data storage device 618. Paging takes place in the compressed block until it is necessary to write such data to the data storage device 618. Virtual memory compression increases the usable size of the main memory 604, while reducing wear on the data storage device 618.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®), IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

ADDITIONAL DESCRIPTION AND EXAMPLES

Example 1 can include subject matter (such as a memory device) comprising a memory array including memory cells; an interface configured to receive memory access requests; and a memory control unit operatively coupled to the memory array and the interface. The memory control unit includes a processor configured to execute instructions stored on the memory device that, when executed by the processor, cause the processor to: control operation of the memory array according to a first memory management protocol for memory access operations, the first memory management protocol including boundary conditions for multiple operating conditions comprising program/erase (P/E) cycles, error management operations, drive writes per day (DWPD), and power consumption; monitor operating conditions of the memory array for the P/E cycles, error management operations, DWPD, and power consumption; determine when a boundary condition for one of the multiple operating conditions is met; and in response to determining that a first boundary condition for a first monitored operating condition is met, change one or more operating conditions of the first memory management protocol to establish a second memory management protocol for the memory access operations, the second memory management protocol including a changed boundary condition of a second monitored operating condition.

In Example 2, the subject matter of Example 1 optionally includes a first memory management protocol that includes a memory cell defectivity protocol. The processor is optionally configured to execute instructions that cause the processor to: monitor an activation rate at which the memory cell defectivity protocol is activated; and establish the second memory management protocol by changing one or more of a number of memory cells subject to error detection for a memory access request, a number of parity bits stored for a memory access request, and an amount of duplicated data written as part of the memory access request in response to a determined memory cell defectivity protocol activation rate.

In Example 3, the subject matter of one or both of Examples 1 and 2 optionally include a processor configured to execute instructions that cause the processor to: monitor a rate of P/E cycles of the memory array performed in response to the memory access requests; and establish the second memory management protocol by changing an access policy to memory cell cache by the memory access requests according to a determined rate of P/E cycles.

In Example 4, the subject matter of Example 3 optionally includes a processor configured to execute instructions that cause the processor to: establish the second memory management protocol by reallocating memory cells included in a single level cell (SLC) cache to multiple level cell (MLC) storage according to the determined rate of the P/E cycles.

In Example 5, the subject matter of one or any combination of Examples 1-4 optionally includes a processor configured to execute instructions that cause the processor to: monitor operating conditions of the memory array for memory cell endurance; and establish the second memory management protocol by changing access to a number of single level cells (SLCs) and multiple level cell (MLCs) given to the memory access requests according to a determined operating condition of the memory array for memory cell endurance.

In Example 6, the subject matter of one or any combination of Examples 1-5 optionally includes a processor configured to execute instructions that cause the processor to: monitor operating conditions of the memory array for memory cell endurance; and establish the second memory management protocol by changing one or more of a number of memory cells subject to error detection for a memory access request, a number of parity bits stored for the memory access request, and an amount of duplicated data written as part of the memory access request according to a determined operating condition of the memory array for memory cell endurance.

In Example 7, the subject matter of one or any combination of Examples 1-6 optionally includes a processor configured to execute instructions that cause the processor to: establish the second memory management protocol by changing one or more of a number of memory cells subject to error detection, an amount of duplicated data written to the memory array, a number of parity bits stored, and an access policy to memory cell cache granted to the memory access requests according to a determined operating condition of the memory array for power consumption.

Example 8 can include subject matter (such as a method of operating a memory device) or can optionally be combined with the subject matter of one or any combination of Examples 1-7 to include such subject matter, comprising receiving memory access requests to a memory array of the memory device from a host device; accessing the memory array of the memory device according to a first memory management protocol, the first memory management protocol including boundary conditions for multiple operating conditions comprising program/erase (P/E) cycles, error management operations, drive writes per day (DWPD), and power consumption; monitoring operating conditions of the memory array for the P/E cycles, error management operations, DWPD, and power consumption; determining when a boundary condition for one of the multiple operating conditions is met; and changing, in response to determining that a first boundary condition for a first monitored operating condition is met, one or more operating conditions of the first memory management protocol to establish a second memory management protocol for the memory access operations, the second memory management protocol including a change boundary condition of a second monitored operating condition.

In Example 9, the subject matter of Example 8 optionally includes monitoring a level of memory cell defectivity; and changing a number of parity bits stored in the memory array and changing an amount of duplicated data stored in the memory array according to a determined level of memory cell defectivity.

In Example 10, the subject matter of one or both of Examples 8 and 9 optionally includes determining a level of memory cell defectivity; and changing a number of memory cells subject to error detection according to a determined level of memory cell defectivity.

In Example 11, the subject matter of one or any combination of Examples 8-10 optionally includes monitoring memory cell access rate; and changing an access policy to memory cell cache by the memory access requests according to a determined memory cell access rate.

In Example 12, the subject matter of one or any combination of Examples 8-11 optionally includes monitoring memory cell access rate; and reallocating memory cells in a single level cell (SLC) cache to multiple level cell (MLC) storage.

In Example 13, the subject matter of one or any combination of Examples 8-12 optionally includes monitoring the operating conditions for memory cell endurance; and changing access to a number of single level cells (SLCs) and multiple level cell (MLCs) given to the memory access requests according to a determined operating condition of the memory array for memory cell endurance.

In Example 14, the subject matter of one or any combination of Examples 8-13 optionally includes monitoring the operating conditions for memory cell endurance; and changing one or more of a number of memory cells subject to error detection for a memory access request, a number of parity bits stored for the memory access request, and an amount of duplicated data written as part of the memory access request according to a determined operating condition of the memory array for memory cell endurance.

In Example 15, the subject matter of one or any combination of Examples 8-14 optionally includes determining power consumption by the memory array in responding to the memory access requests; and changing one or more of a number of memory cells subject to error detection, an amount of duplicated data written to the memory array; a number of parity bits stored, and an access policy to memory cell cache granted to the memory access requests according to a determined power consumption.

Example 16 can include subject matter (such as a system) or can optionally be combined with one or any combination of Examples 1-15 to include such subject matter, comprising a host device and a memory device. The memory device includes a memory array that includes memory cells, an interface configured to receive memory access requests from the host device, and a memory control unit operatively coupled to the memory array and the interface. The memory control unit includes a processor configured to execute instructions stored on the memory device that, when executed by the processor, cause the processor to: control operation of the memory array according to a first memory management protocol for memory access operations, the first memory protocol including boundary conditions for multiple operating conditions comprising program/erase (P/E) cycles, error management operations, drive writes per day (DWPD), and power consumption; monitor operating conditions of the memory array for the P/E cycles, error management operations, DWPD, and power consumption; determine when a boundary condition for one of the multiple operating conditions is met; and in response to determining that a first boundary condition for a first monitored operating condition is met, change one or more operating conditions of the first memory management protocol to establish a second memory management protocol for the memory access operations, the second memory management protocol including a change boundary condition of a second monitored operating condition.

In Example 17, the subject matter of Example 16 optionally includes a first memory management protocol includes a memory cell defectivity protocol. The processor is optionally configured to execute instructions that cause the processor to: monitor an activation rate at which the memory cell defectivity protocol is activated; and establish the second memory management protocol by changing one or more of a number of memory cells subject to error detection for a memory access request, a number of parity bits stored for a memory access request, and an amount of duplicated data written as part of the memory access request in response to a determined memory cell defectivity protocol activation rate.

In example 18, the subject matter of one or both of Examples 16 and 17 optionally includes a processor configured to execute instructions that cause the processor to: monitor a rate of P/E cycles requested by the host device; and establish the second memory management protocol by changing an access policy to memory cell cache by the memory access requests according to a determined rate of P/E cycles.

In Example 19, the subject matter of one or any combination of Examples 16-18 optionally includes a processor configured to execute instructions that cause the processor to: monitor operating conditions of the memory array for memory cell endurance; and establish the second memory management protocol by changing access to a number of single level cells (SLCs) and multiple level cell (MLCs) given to the memory access requests according to a determined operating condition of the memory array for memory cell endurance.

In Example 20, the subject matter of one or any combination of Examples 16-19 optionally includes a processor configured to execute instructions that cause the processor to: monitor operating conditions of the memory array for memory cell endurance; and establish the second memory management protocol by changing one or more of a number of memory cells subject to error detection for a memory access request, a number of parity bits stored for the memory access request, and an amount of duplicated data written as part of the memory access request according to a determined operating condition of the memory array for memory cell endurance.

In Example 21, the subject matter of one or any combination of Examples 16-20 optionally includes a processor configured to execute instructions that cause the processor to: establish the second memory management protocol by changing one or more of a number of memory cells subject to error detection, an amount of duplicated data written to the memory array, a number of parity bits stored, and an access policy to memory cell cache granted to the memory access requests according to a determined operating condition of the memory array for power consumption.

These non-limiting examples can be combined in any permutation or combination. The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
a memory array including memory cells;
an interface configured to receive memory access requests; and
a memory control unit operatively coupled to the memory array and the interface, the memory control unit comprising a processor configured to execute instructions stored on the memory device that, when executed by the processor, cause the processor to:
control operation of the memory array according to a first memory management protocol for memory access operations, the first memory management protocol including a memory cell defectivity protocol and including boundary conditions for multiple operating conditions comprising program/erase (P/E) cycles, error management operations, drive writes per day (DWPD), and power consumption;
monitor operating conditions of the memory array for the P/E cycles, error management operations, DWPD, and power consumption;
determine when a boundary condition for one of the multiple operating conditions is met;
in response to determining that a first boundary for a first monitored operating condition is met, change one or more operating conditions of the first memory management protocol to establish a second memory management protocol for the memory access operations, the second memory management protocol including a changed boundary condition of a second monitored operating condition;
monitor an activation rate at which the memory cell defectivity protocol is activated; and
establish the second memory management protocol by changing one or more of a number of memory cells subject to error detection for a memory access request, a number of parity bits stored for a memory access request, and an amount of duplicated data written as part of the memory access request in response to a determined memory cell defectivity protocol activation rate.

2. The memory device of claim 1, wherein the processor is configured to execute instructions that cause the processor to:
monitor a rate of P/E cycles of the memory array performed in response to the memory access requests; and
establish the second memory management protocol by changing an access policy to memory cell cache by the memory access requests according to a determined rate of P/E cycles.

3. The memory device of claim 2, wherein the processor is configured to execute instructions that cause the processor to: establish the second memory management protocol by reallocating memory cells included in a single level cell (SLC) cache to multiple level cell (MLC) storage according to the determined rate of the P/E cycles.

4. The memory device of claim 1, wherein the processor is configured to execute instructions that cause the processor to:
monitor operating conditions of the memory array for memory cell endurance; and
establish the second memory management protocol by changing access to a number of single level cells (SLCs) and multiple level cell (MLCs) given to the memory access requests according to a determined operating condition of the memory array for memory cell endurance.

5. The memory device of claim 1, wherein the processor is configured to execute instructions that cause the processor to:
monitor operating conditions of the memory array for memory cell endurance; and
establish the second memory management protocol by changing one or more of a number of memory cells subject to error detection for a memory access request, a number of parity bits stored for the memory access request, and an amount of duplicated data written as part of the memory access request according to a determined operating condition of the memory array for memory cell endurance.

6. The memory device of claim 1, wherein the processor is configured to execute instructions that cause the processor to:
 establish the second memory management protocol by changing one or more of a number of memory cells subject to error detection, an amount of duplicated data written to the memory array, a number of parity bits stored, and an access policy to memory cell cache granted to the memory access requests according to a determined operating condition of the memory array for power consumption.

7. A method of operating a memory device, the method comprising:
 receiving memory access requests to a memory array of the memory device from a host device;
 accessing the memory array of the memory device according to a first memory management protocol, the first memory management protocol including boundary conditions for multiple operating conditions comprising program/erase (P/E) cycles, error management operations, drive writes per day (DWPD), and power consumption;
 monitoring operating conditions of the memory array for the P/E cycles, error management operations, DWPD, power consumption, and a level of memory cell defectivity;
 determining when a boundary condition for one of the multiple operating conditions is met; and
 changing, in response to determining that a first boundary condition for a first monitored operating condition is met, one or more operating conditions of the first memory management protocol to establish a second memory management protocol for the memory access operations, the second memory management protocol including a changed boundary condition of a second monitored operating condition; and
 changing one or both of a number of parity bits stored in the memory array and an amount of duplicated data stored in the memory array according to a determined level of memory cell defectivity.

8. The method of claim 7,
 wherein monitoring the operating conditions includes determining a level of memory cell defectivity; and
 wherein changing the one or more operating conditions includes changing a number of memory cells subject to error detection according to a determined level of memory cell defectivity.

9. The method of claim 7,
 wherein monitoring the operating conditions includes monitoring memory cell access rate; and
 wherein changing the one or more operating conditions includes changing an access policy to memory cell cache by the memory access requests according to a determined memory cell access rate.

10. The method of claim 9, changing the access policy to memory cell cache includes reallocating memory cells in a single level cell (SLC) cache to multiple level cell (MLC) storage.

11. The method of claim 7,
 wherein monitoring the operating conditions includes monitoring the operating conditions for memory cell endurance; and
 wherein changing the one or more operating conditions includes changing access to a number of single level cells (SLCs) and multiple level cell (MLCs) given to the memory access requests according to a determined operating condition of the memory array for memory cell endurance.

12. The method of claim 7,
 wherein monitoring the operating conditions includes monitoring the operating conditions for memory cell endurance; and
 wherein changing the one or more operating conditions includes changing one or more of a number of memory cells subject to error detection for a memory access request, a number of parity bits stored for the memory access request, and an amount of duplicated data written as part of the memory access request according to a determined operating condition of the memory array for memory cell endurance.

13. The method of claim 7,
 wherein determining the performance parameters includes determining power consumption by the memory array in responding to the memory access requests; and
 wherein changing the one or more operating conditions includes changing one or more of a number of memory cells subject to error detection, an amount of duplicated data written to the memory array, a number of parity bits stored, and an access policy to memory cell cache granted to the memory access requests according to a determined power consumption.

14. A system comprising:
 a host device; and
 a memory device, the memory device including:
 a memory array including memory cells;
 an interface configured to receive memory access requests from the host device;
 a memory control unit operatively coupled to the memory array and the interface, the memory control unit comprising a processor configured to execute instructions stored on the memory device that, when executed by the processor, cause the processor to:
 control operation of the memory array according to a first memory management protocol for memory access operations, the first memory management protocol including a memory cell defectivity protocol and boundary conditions for multiple operating conditions comprising program/erase (P/E) cycles, error management operations, drive writes per day (DWPD), and power consumption;
 monitor operating conditions of the memory array for the P/E cycles, error management operations, DWPD, power consumption, and memory cell endurance;
 determine when a boundary condition for one of the multiple operating conditions is met;
 in response to determining that a first boundary condition for a first monitored operating condition is met, change one or more operating conditions of the first memory management protocol to establish a second memory management protocol for the memory access operations, the second memory management protocol including a changed boundary condition of a second monitored operating condition;
 and establish the second memory management protocol by changing one or more of a number of memory cells subject to error detection for a memory access request, a number of parity bits stored for the memory access request, and an amount of duplicated data written as part of the memory access request according to a determined operating condition of the memory array for memory cell endurance.

15. The system of claim 14,
wherein the processor is configured to execute instructions that cause the processor to:
monitor an activation rate at which the memory cell defectivity protocol is activated; and establish the second memory management protocol by changing one or more of a number of memory cells subject to error detection for a memory access request, a number of parity bits stored for a memory access request, and an amount of duplicated data written as part of the memory access request in response to a determined memory cell defectivity protocol activation rate.

16. The system of claim 14, wherein the processor is configured to execute instructions that cause the processor to:
monitor a rate of P/E cycles requested by the host device; and
establish the second memory management protocol by changing an access policy to memory cell cache by the memory access requests according to a determined rate of P/E cycles.

17. The system of claim 14, wherein the processor is configured to execute instructions that cause the processor to:
monitor operating conditions of the memory array for memory cell endurance; and
establish the second memory management protocol by changing access to a number of single level cells (SLCs) and multiple level cell (MLCs) given to the memory access requests according to a determined operating condition of the memory array for memory cell endurance.

18. The system of claim 14, wherein the processor is configured to execute instructions that cause the processor to:
establish the second memory management protocol by changing one or more of a number of memory cells subject to error detection, an amount of duplicated data written to the memory array, a number of parity bits stored, and an access policy to memory cell cache granted to the memory access requests according to a determined operating condition of the memory array for power consumption.

* * * * *